United States Patent
Liu et al.

(10) Patent No.: US 10,978,153 B1
(45) Date of Patent: Apr. 13, 2021

(54) 3D NAND FLASH AND OPERATION METHOD THEREOF

(71) Applicant: Yangtze Memory Technologies Co., Ltd., Wuhan (CN)

(72) Inventors: Hongtao Liu, Wuhan (CN); Song Min Jiang, Wuhan (CN); Dejia Huang, Wuhan (CN); Ying Huang, Wuhan (CN); Wenzhe Wei, Wuhan (CN)

(73) Assignee: Yangtze Memory Technologies Co., Ltd., Wuhan (CN)

( * ) Notice: Subject to any disclaimer, the term of this patent is extended or adjusted under 35 U.S.C. 154(b) by 0 days.

(21) Appl. No.: 16/907,299

(22) Filed: Jun. 21, 2020

Related U.S. Application Data

(63) Continuation of application No. PCT/CN2020/090997, filed on May 19, 2020.

(51) Int. Cl.

| | | |
|---|---|---|
| *G11C 16/04* | (2006.01) | |
| *G11C 16/10* | (2006.01) | |
| *G11C 16/08* | (2006.01) | |
| *G11C 16/34* | (2006.01) | |
| *G11C 16/26* | (2006.01) | |
| *G11C 16/14* | (2006.01) | |

(52) U.S. Cl.
CPC .......... *G11C 16/0483* (2013.01); *G11C 16/08* (2013.01); *G11C 16/10* (2013.01); *G11C 16/14* (2013.01); *G11C 16/26* (2013.01); *G11C 16/3459* (2013.01)

(58) Field of Classification Search
CPC ..... G11C 16/0483; G11C 16/08; G11C 16/26; G11C 16/10; G11C 16/14; G11C 16/3459
USPC ......................................... 365/185.17, 185.24
See application file for complete search history.

(56) References Cited

U.S. PATENT DOCUMENTS

| | | | | |
|---|---|---|---|---|
| 10,741,262 | B2* | 8/2020 | Lin | G11C 11/5628 |
| 2007/0247908 | A1* | 10/2007 | Aritome | G11C 16/26 |
| | | | | 365/185.17 |
| 2008/0025097 | A1* | 1/2008 | Aritome | G11C 16/12 |
| | | | | 365/185.18 |
| 2009/0040833 | A1* | 2/2009 | Shin | G11C 16/10 |
| | | | | 365/185.19 |
| 2010/0232234 | A1* | 9/2010 | Damle | G11C 16/3404 |
| | | | | 365/185.26 |
| 2012/0224429 | A1* | 9/2012 | Moschiano | G11C 16/06 |
| | | | | 365/185.19 |
| 2013/0163326 | A1* | 6/2013 | Lee | G11C 16/3418 |
| | | | | 365/185.2 |
| 2013/0258771 | A1* | 10/2013 | Lee | G11C 16/24 |
| | | | | 365/185.02 |

(Continued)

*Primary Examiner* — Michael T Tran
(74) *Attorney, Agent, or Firm* — Winston Hsu

(57) ABSTRACT

An operation method for a 3D NAND flash includes writing data into a WLn layer of the plurality of wordline layers of an unselect bit line of the plurality of bit lines in a write operation; and applying a first pass voltage on at least a first WL layer of the plurality of wordline layers of the unselect bit line of the plurality of bit lines and applying a second pass voltage on at least a second WL layer of the plurality of wordline layers of the unselect bit line of the plurality of bit lines; wherein the first pass voltage is lower than the second pass voltage to reduce a difference of channel potential between the WLn layer and the at least a first WL layer when a pre-pulse phase is removed from a verify phase.

18 Claims, 6 Drawing Sheets

(56) References Cited

U.S. PATENT DOCUMENTS

| | | | |
|---|---|---|---|
| 2014/0219032 A1* | 8/2014 | Moschiano | G11C 16/3454 |
| | | | 365/185.19 |
| 2015/0294726 A1* | 10/2015 | Sim | G11C 16/0483 |
| | | | 365/185.12 |
| 2016/0260732 A1* | 9/2016 | Lue | H01L 27/11565 |
| 2019/0147959 A1* | 5/2019 | Hsu | G11C 16/0483 |
| | | | 365/185.12 |
| 2019/0318784 A1* | 10/2019 | Lee | G11C 11/5642 |
| 2020/0006379 A1* | 1/2020 | Nishikawa | H01L 29/1037 |
| 2020/0143883 A1* | 5/2020 | Joo | G11C 16/32 |
| 2020/0202933 A1* | 6/2020 | Joo | G11C 16/10 |

* cited by examiner

3D NAND FLASH AND OPERATION METHOD THEREOF

CROSS REFERENCE TO RELATED APPLICATIONS

This is a continuation application of International Application No. PCT/CN2020/090997 filed on May 19, 2020, which is incorporated herein by reference.

BACKGROUND OF THE INVENTION

1. Field of the Invention

The present invention relates to an operation method for 3D NAND flash and a 3D NAND flash, and more particularly, to an operation method for 3D NAND flash and a 3D NAND flash capable of reducing a write time and power consumption of the 3D NAND flash.

2. Description of the Prior Art

In order to control threshold voltages in a write operation and implement storage of multiple data of a NAND flash memory, increment step pulse program (ISPP) technique is widely adopted. The ISPP technique is configured to interleave with program verify phases of the threshold voltage between two programming operations. Memory cells of the NAND flash memory, which pass the program verify phase, are performed inhibit program; memory cells of the NAND flash memory, which do not pass the program verify phase, are preceded to the ISPP technique. The ISPP technique includes a pre-charge phase and a programming phase, wherein the pre-charge phase enhances a coupling potential of channels and reduces programming interference. The program verify phases usually include a pre-pulse phase, a read phase and a pre-cutoff phase, wherein the pre-pulse phase and the pre-cutoff phase are utilized for reducing injection of electrons.

For a 3D NAND flash memory with vertical channel, in order to prevent leakage interference of voltage from unselect strings in the program verify phases, upper select gates of unselect strings are usually cutting off and lower select gates of the unselect stings are turned on and shared. However, for an unselect string, when a memory cell corresponding to a wordline WLn of the unselect string is in a programming phase, the wordline WLn is a select wordline and is verified by a verify voltage. When the verify voltage is smaller than a threshold voltage of the memory cell, the unselect strings of the select memory cell are turned off, a difference of channel potential between the wordline WLn and a wordline WLn+1 occurs, and interference is generated due to electron injection of the wordline WLn+1. A conventional solution to the above issue is adding the pre-pulse phase before the verify phase, but a writing time is thereby increased. Therefore, improvements are necessary to the prior arts.

SUMMARY OF THE INVENTION

The present invention provides an operation method for 3D NAND flash and a 3D NAND flash to reduce a write time and power consumption of the 3D NAND flash.

An embodiment of the present invention discloses an operation method for a 3D NAND flash having a plurality of bit lines, wherein the plurality of bit lines comprises a plurality of wordline (WL) layers, the operation method comprises writing data into a WLn layer of the plurality of wordline layers of an unselect bit line of the plurality of bit lines according to a writing sequence from a first end of the plurality of wordline layers to a second end of the plurality of wordline layers in a write operation; and applying a first pass voltage on at least a first WL layer of the plurality of wordline layers of the unselect bit line of the plurality of bit lines and applying a second pass voltage on at least a second WL layer of the plurality of wordline layers of the unselect bit line of the plurality of bit lines; wherein the first pass voltage is lower than the second pass voltage to reduce a difference of channel potential between the WLn layer and the at least a first WL layer when a pre-pulse phase is removed from a verify phase.

Another embodiment of the present invention discloses a 3D NAND flash, having a plurality of bit lines, wherein the plurality of bit lines comprises a plurality of wordline (WL) layers, the 3D NAND flash comprises a select bit line; at least an unselect bit line; a controller, configured to write data into a WLn layer of the plurality of wordline layers of the at least an unselect bit line of the plurality of bit lines according to a writing sequence from a first end of the plurality of wordline layers to a second end of the plurality of wordline layers in a write operation, apply a first pass voltage on at least a first WL layer of the plurality of wordline layers of the at least an unselect bit line of the plurality of bit lines and apply a second pass voltage on at least a second WL layer of the plurality of wordline layers of the at least an unselect bit line of the plurality of bit lines; wherein data are written into the WLn layer according to a writing sequence from a first end of the plurality of wordline layers to a second end of the plurality of wordline layers in a write operation; wherein the first pass voltage is lower than the second pass voltage to reduce a difference of channel potential between the WLn layer and the at least a first WL layer when a pre-pulse phase is removed from a verify phase.

These and other objectives of the present invention will no doubt become obvious to those of ordinary skill in the art after reading the following detailed description of the preferred embodiment that is illustrated in the various figures and drawings.

DETAILED DESCRIPTION

In order to reduce a write time of 3D NAND flash, a pre-pulse phase is removed from program verify phases.

Figure 1:
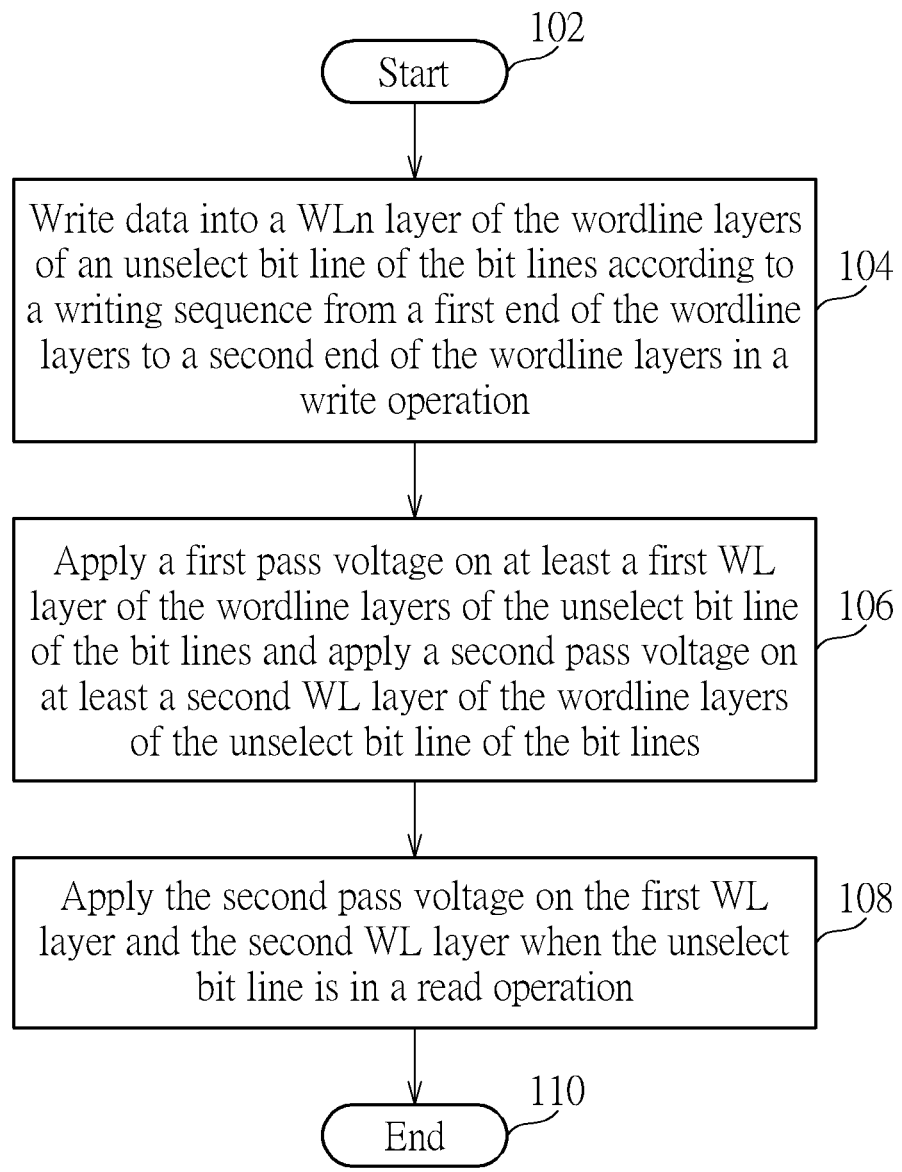
FIG. 1 is a schematic diagram of an operation process for a 3D NAND flash according to an embodiment of the present invention.

FIG. 1 is a schematic diagram of an operation process 10 for a 3D NAND flash according to an embodiment of the present invention. The 3D NAND flash may include a plurality of bit lines, wherein the bit lines comprise a plurality of wordline (WL) layers. The operation process 10 for the 3D NAND flash includes the following steps:

Step 102: Start.

Step 104: Write data into a WLn layer of the wordline layers of an unselect bit line of the bit lines according to a writing sequence from a first end of the wordline layers to a second end of the wordline layers in a write operation.

Step 106: Apply a first pass voltage on at least a first WL layer of the wordline layers of the unselect bit line of the bit lines and apply a second pass voltage on at least a second WL layer of the wordline layers of the unselect bit line of the bit lines.

Step 108: Apply the second pass voltage on the first WL layer and the second WL layer when the unselect bit line is in a read operation.

Step 110: End.

Figure 2:
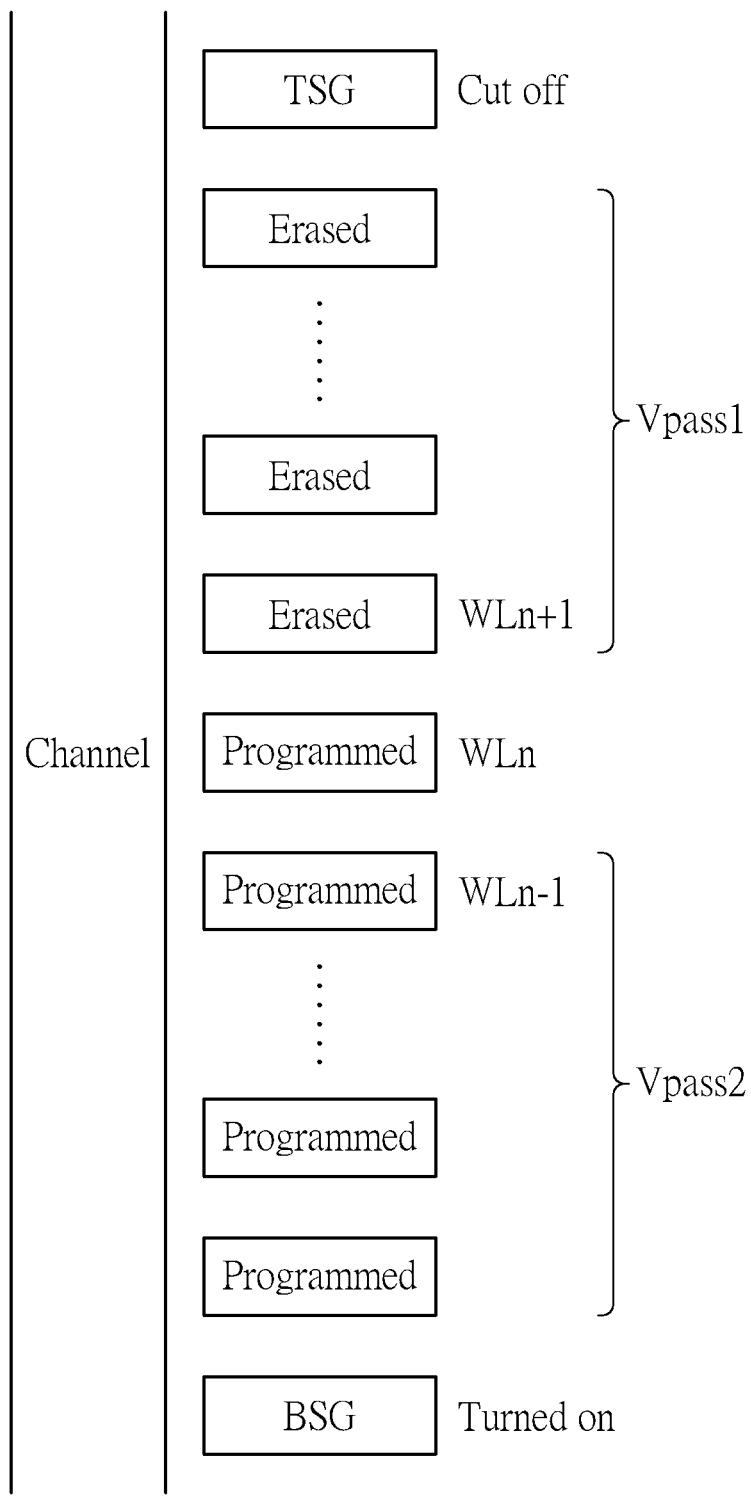
FIG. 2 is a schematic diagram of an unselect bit line of the 3D NAND flash applying the operation process according to an embodiment of the present invention.

To explain the operation process 10, please also refer to FIG. 2, which is a schematic diagram of an unselect bit line of a 3D NAND flash applying the operation process 10 according to an embodiment of the present invention. The operation process 10 may be executed by a controller (not illustrated in the drawings) of the 3D NAND flash. As shown in FIG. 2, the unselect bit line includes a top select gate TSG, the first wordline layers, the WLn layer, the second wordline layers and a bottom select gate BSG.

Since the write operation of the 3D NAND flash may be started from one end of the top select gate TSG or the bottom select gate BSG, in an embodiment, the data is written from the bottom select gate BSG to the top select gate TSG, but is not limited thereto. The write operation of the 3D NAND flash may be started from the top select gate TSG to the bottom select gate BSG in other embodiments.

According to the operation process 10, in step 104, in the write operation of the 3D NAND flash, the data are written respectively into the layers of the 3D NAND flash of the unselect bit line according to the writing sequence. In an embodiment, when the data are written into the WLn layer of the wordline layers of the unselect bit line, i.e. the WLn layer is a current layer. The first WL layers are layers in an erased state between the top select gate TSG and the WLn layer of the wordline layers, and the second WL layers are programmed between the WLn layer and the bottom select gate BSG of the wordline layers.

In step 106, a first pass voltage Vpass1 is applied on the first WL layers of the wordline layers of the unselect bit line of the bit lines, and a second pass voltage Vpass2 is applied on the second WL layers of the wordline layers of the unselect bit line of the bit lines. In an embodiment, the first pass voltage Vpass1 is higher than a minimal program-verify level of the 3D NAND flash in a verify phase, which is 1 to 2 volts higher than a minimal distribution of program-verify level of the 3D NAND flash. For example, when the 3D NAND flash is a multi-level cell (MLC) 3D NAND flash, which includes four states corresponding to bit codes 11, 10, 01, 00, i.e. programmed states P0, P1, P2, P3, wherein the programmed state P0 is the minimal distribution of program-verify level. In this example, the first pass voltage Vpass1 is 1 to 2 volts higher than the programmed state P0. In addition, the second pass voltage Vpass2 is larger than a maximal program-verify level of the 3D NAND flash to turn on a channel of a corresponding bit line. That is, the second pass voltage Vpass2 is larger than the programmed state P3 when the 3D NAND flash is the MLC 3D NAND flash.

In an embodiment, the verify phase is performed after the data are written into the WLn layers. In other words, after the WLn layer is programmed, the verify phase is performed on the WLn layer to verify the WLn layer by increment step pulse program (ISPP) technique with threshold voltages corresponding to the program-verify levels. Since the first pass voltage Vpass1 is lower than the second pass voltage Vpass2, a difference of channel potential between the WLn layer and the WLn+1 layer is reduced when the pre-pulse phase is removed from the verify phase. In addition, interference generated by electron injection from the WLn+1 layer to the WLn layer is reduced accordingly.

Notably, in the verify phase of the write operation according to the operation process 10, the top select gate TSG is turned off and the bottom select gate BSG is turned on, such that the bottom select gate BSG is shared with other bit lines. Alternatively, the bottom select gate BSG may be turned off to reduce the difference of channel potential in other embodiments.

Figure 3:
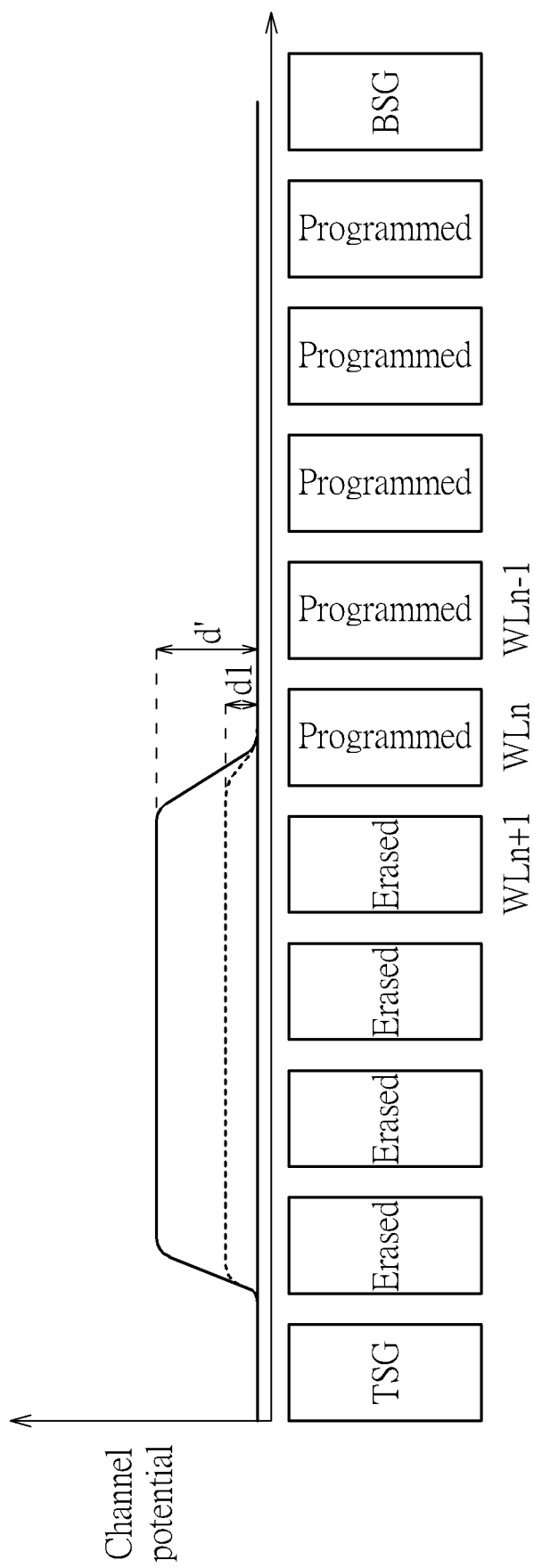
FIG. 3 is a schematic diagram of a distribution of channel potential of the unselect bit line of the 3D NAND flash according to an embodiment of the present invention.

FIG. 3 is a schematic diagram of a distribution of the channel potential of the unselect bit line of the 3D NAND flash according to an embodiment of the present invention. As shown in FIG. 3, the difference dl of channel potential between the WLn+1 layer of the first WL layers and the WLn layer applying the operation process 10 is reduced in comparison to a difference d' of channel potential between the WLn+1 layer of the first WL layers and the WLn layer in the prior art.

Figure 4:
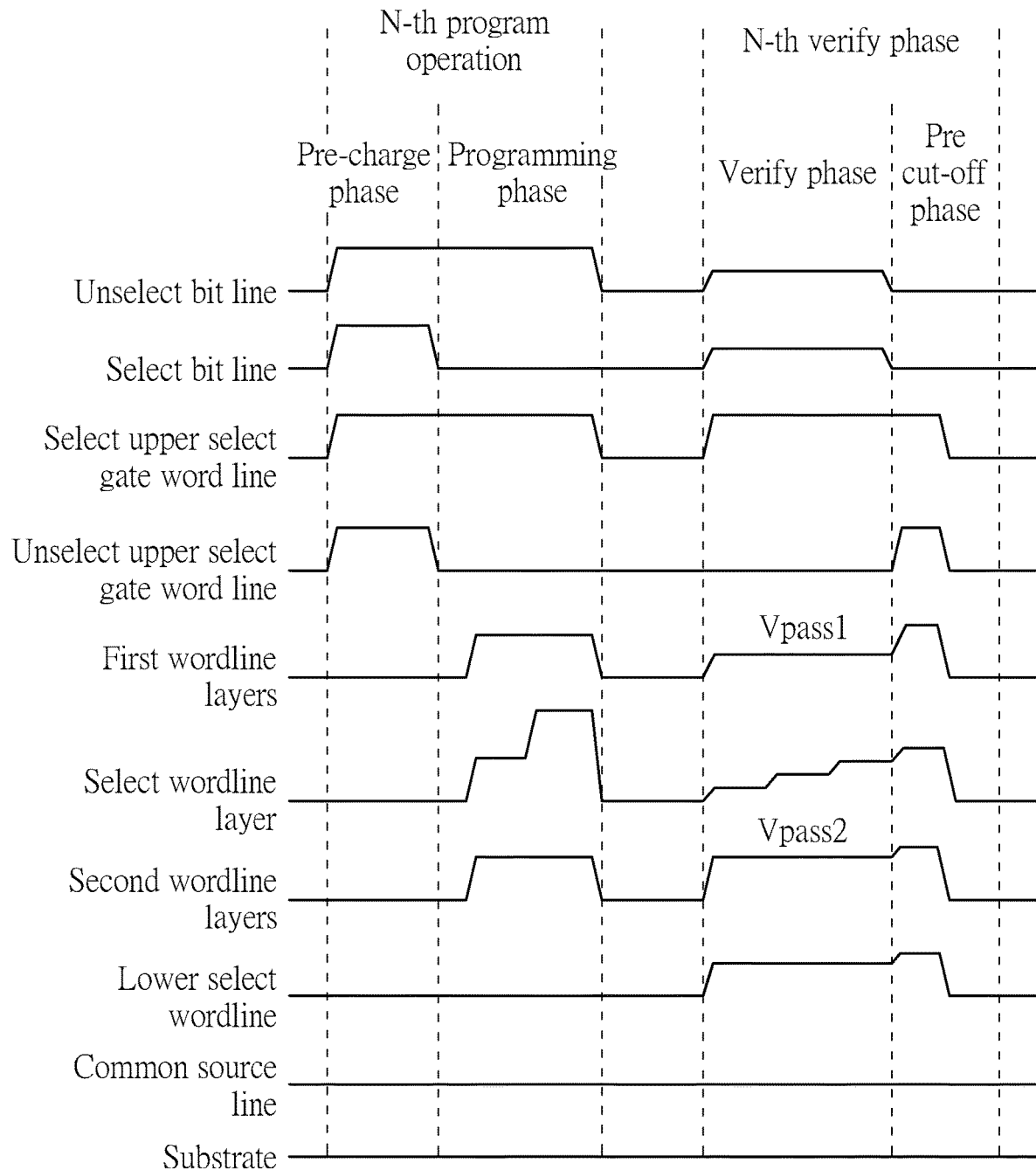
FIG. 4 is a waveform diagram of the unselect bit string of the 3D NAND flash applying the operation process according to an embodiment of the present invention.

FIG. 4 is a waveform diagram of the unselect bit string of the 3D NAND flash applying the operation process 10 according to an embodiment of the present invention. As shown in FIG. 4, the unselect bit string includes an unselect bit line, a select bit line, a select upper select gate word line, the first wordline layers, a select wordline (i.e. the WLn layer), the second wordline layers, a lower select wordline, a common source line and a substrate. In FIG. 4, after an N-th program operation, which includes a pre-charge phase and a programming phase, an N-th verify phase, which includes the verify phase and a pre cut-off phase, is performed. Since the pre-pulse phase is removed from the verify phase according to the operation process 10, in the verify phase, the first wordline layers are applied with the first pass voltage Vpass1, the second wordline layers are applied with the second pass voltage Vpass2, and the select wordline (i.e. the WLn layer) is applied with different threshold voltages for verify phase.

Figure 5:
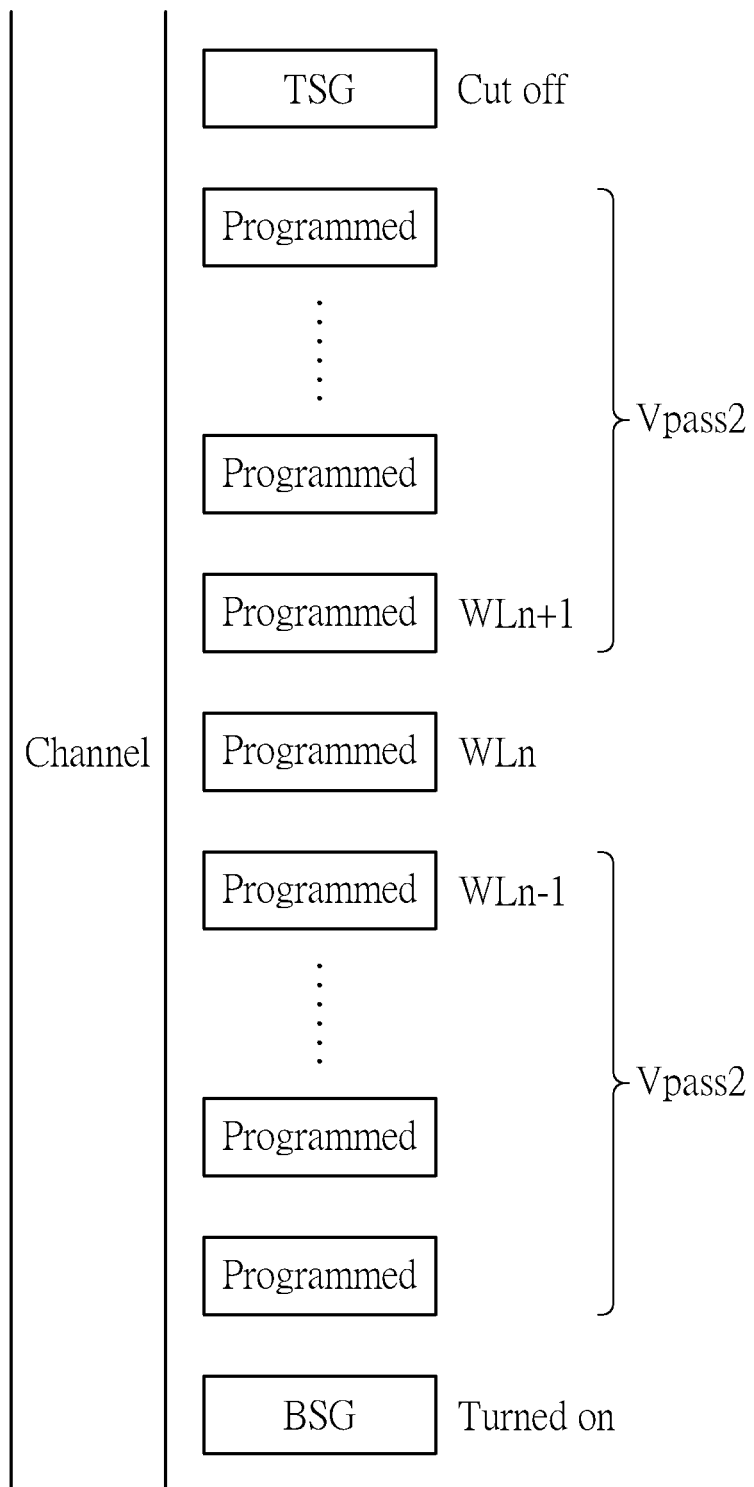
FIG. 5 is a schematic diagram of the unselect bit line of the 3D NAND flash in the read operation applying the operation process according to an embodiment of the present invention.

Referring to a read operation of the operation process 10, in step 108, the second pass voltage Vpass2 is applied on the first WL layers and the second WL layers. Please refer to FIG. 5 simultaneously, which is a schematic diagram of the unselect bit line of the 3D NAND flash in the read operation applying the operation process 10 according to an embodiment of the present invention.

Figure 6:
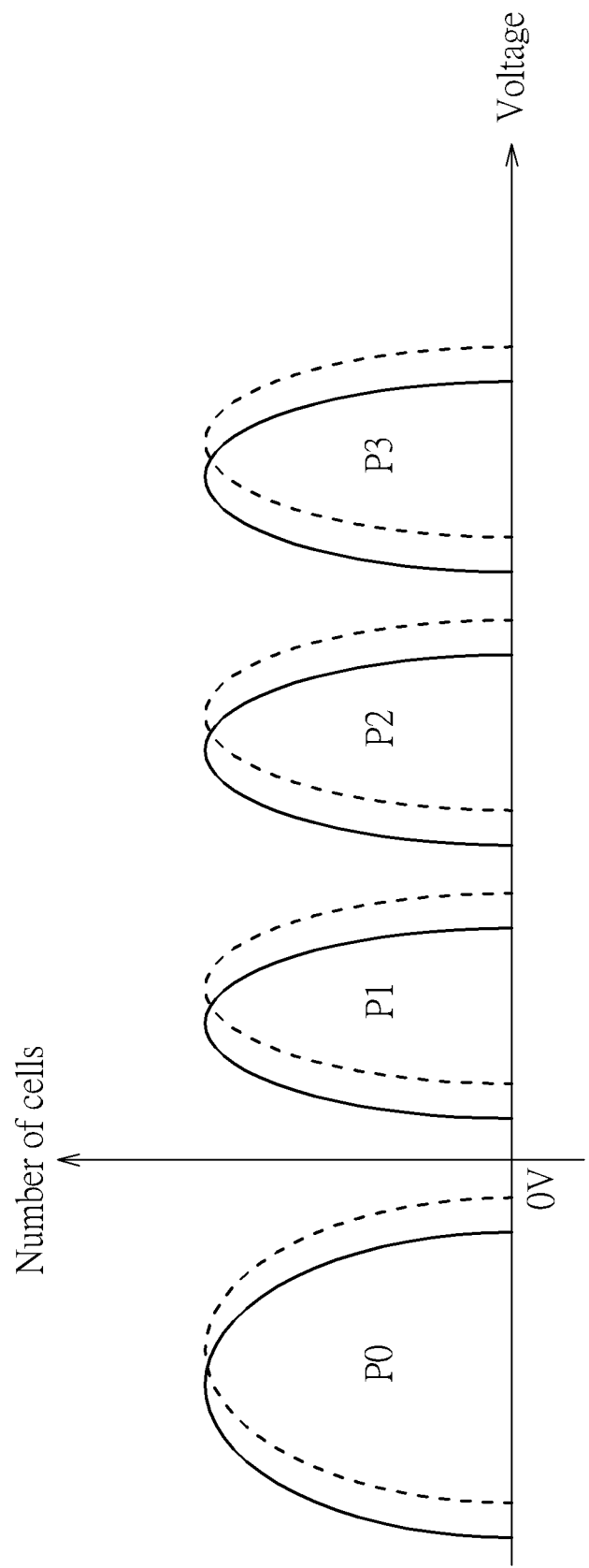
FIG. 6 is a schematic diagram of a distribution shift of program-verify level applying the operation process according to an embodiment of the present invention.

After the data are written into corresponding memory cell of the 3D NAND flash, the first WL layers should be applied with the voltage as same as the second WL layers, i.e. the second pass voltage Vpass2. Since the first WL layers and the second WL layers are respectively applied with the first pass voltage Vpass1 and the second pass voltage Vpass2 in the write operation, a distribution shift of program-verify level of the 3D NAND flash in the read operation is generated. As shown in FIG. 6, dash lines represent the distributions of program-verify level in the write operation and solid lines represent the distributions of program-verify levels in the read operation. As such, the threshold voltages corresponding to different program-verify levels in the read operation are lower than the threshold voltages corresponding to different program-verify levels in the write operation, verify voltages corresponding to the distributions of program-verify levels, i.e. the programmed states P0, P1, P2, P3, are increased to compensate the distribution difference of program-verify levels between the write operation and the read operation.

Therefore, the first WL layers of the wordline layers are applied with the first pass voltage Vpass1 and the second WL layers of the wordline layers are applied with the second pass voltage Vpass2 to reduce the difference of channel potential between the WLn layer and the WLn+1 layer of the first WL layers when the pre-pulse phase is removed from the verify phase, wherein the first pass voltage Vpass1 is lower than the second pass voltage Vpass2, since the electron injection from the WLn+1 layer to the WLn layer is reduced.

Notably, the embodiments stated above illustrate the concept of the present invention, those skilled in the art may make proper modifications accordingly, and not limited thereto.

In summary, the present invention provides an operation method for 3D NAND flash and a 3D NAND flash, which reduces the electron injection in tunnel to reduce a write time and power consumption of the 3D NAND flash.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. An operation method for a 3D NAND flash having a plurality of bit lines, wherein the plurality of bit lines comprises a plurality of wordline (WL) layers, the operation method comprising:
    writing data into a WLn layer of the plurality of wordline layers of an unselect bit line of the plurality of bit lines according to a writing sequence from a first end of the plurality of wordline layers to a second end of the plurality of wordline layers in a write operation; and
    applying a first pass voltage on at least a first WL layer of the plurality of wordline layers of the unselect bit line of the plurality of bit lines and applying a second pass voltage on at least a second WL layer of the plurality of wordline layers of the unselect bit line of the plurality of bit lines;
    wherein the first pass voltage is lower than the second pass voltage to reduce a difference of channel potential between the WLn layer and the at least a first WL layer when a pre-pulse phase is removed from a verify phase.

2. The operation method of claim 1, wherein the at least a first WL layer is between the first end and the WLn layer of the plurality of wordline layers, and the at least a second WL layer is between the WLn layer and the second end of the plurality of wordline layers.

3. The operation method of claim 1, wherein the at least a first WL layer of the plurality of wordline layers is in an erased state.

4. The operation method of claim 1, wherein the second pass voltage is larger than a maximal program-verify level of the 3D NAND flash to turn on a channel of a corresponding bit line.

5. The operation method of claim 1, wherein the first pass voltage is higher than a minimal distribution of program-verify level of the 3D NAND flash in the verify phase.

6. The operation method of claim 1, wherein the verify phase is performed after the data are written into the WLn layer of the plurality of wordline layers.

7. The operation method of claim 1, wherein the first end and the second end of the plurality of wordline layers are a top select gate and a bottom select gate.

8. The operation method of claim 1, further comprising:
    applying the second pass voltage on the at least a first WL layer and the at least a second WL layer when the unselect bit line is in a read operation.

9. The operation method of claim 8, wherein at least a verify voltage corresponding to at least a program-verify level of the verify phase is increased to compensate a difference between the write operation and the read operation.

10. A 3D NAND flash, having a plurality of bit lines, wherein the plurality of bit lines comprises a plurality of wordline (WL) layers, the 3D NAND flash comprising:
    a select bit line;
    at least an unselect bit line;
    a controller, configured to write data into a WLn layer of the plurality of wordline layers of the at least an unselect bit line of the plurality of bit lines according to a writing sequence from a first end of the plurality of wordline layers to a second end of the plurality of wordline layers in a write operation, apply a first pass voltage on at least a first WL layer of the plurality of wordline layers of the at least an unselect bit line of the plurality of bit lines and apply a second pass voltage on at least a second WL layer of the plurality of wordline layers of the at least an unselect bit line of the plurality of bit lines;
    wherein data are written into the WLn layer according to a writing sequence from a first end of the plurality of wordline layers to a second end of the plurality of wordline layers in a write operation;
    wherein the first pass voltage is lower than the second pass voltage to reduce a difference of channel potential between the WLn layer and the at least a first WL layer when a pre-pulse phase is removed from a verify phase.

11. The 3D NAND flash of claim 10, wherein the at least a first WL layer is between the first end and the WLn layer of the plurality of wordline layers, and the at least a second WL layer is between the WLn layer and the second end of the plurality of wordline layers.

12. The 3D NAND flash of claim 10, wherein the at least a first WL layer of the plurality of wordline layers is in an erased state.

13. The 3D NAND flash of claim 10, wherein the second pass voltage is larger than a maximal program-verify level of the 3D NAND flash to turn on a channel of a corresponding bit line.

14. The 3D NAND flash of claim 10, wherein the first pass voltage is higher than a minimal distribution of program-verify level of the 3D NAND flash in the verify phase.

15. The 3D NAND flash of claim 10, wherein the verify phase is performed after the data are written into the WLn layer of the plurality the plurality of wordline layers.

16. The 3D NAND flash of claim 10, wherein the first end and the second end of the plurality of wordline layers are a top select gate and a bottom select gate.

17. The 3D NAND flash of claim 10, wherein the at least a first WL layer and the at least a second WL layer are applied with the second pass voltage when the at least an unselect bit line is in a read operation.

18. The 3D NAND flash of claim 17, wherein at least a verify voltage corresponding to at least a program-verify level of the verify phase is increased to compensate a difference between the write operation and the read operation.

* * * * *